(12) United States Patent
Komura et al.

(10) Patent No.: US 7,995,374 B2
(45) Date of Patent: Aug. 9, 2011

(54) SEMICONDUCTOR MEMORY DEVICE, METHOD OF MANUFACTURING THE SAME, AND METHOD OF SCREENING THE SAME

(75) Inventors: Masanori Komura, Yokohama (JP); Mitsuru Sato, Kamakura (JP); Kenichi Murooka, Yokohama (JP); Motoya Kishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 12/618,122

(22) Filed: Nov. 13, 2009

(65) Prior Publication Data

US 2010/0238704 A1    Sep. 23, 2010

(30) Foreign Application Priority Data

Mar. 23, 2009   (JP) .................................. 2009-070371

(51) Int. Cl.
*G11C 11/00* (2006.01)
*G11C 11/36* (2006.01)
*G11C 17/00* (2006.01)
*G11C 29/00* (2006.01)

(52) U.S. Cl. ........ 365/148; 365/104; 365/163; 365/175; 365/201

(58) Field of Classification Search ............ 365/148
See application file for complete search history.

(56) References Cited

U.S. PATENT DOCUMENTS

| | | | |
|---|---|---|---|
| 7,408,212 B1 | 8/2008 | Luan et al. | |
| 7,545,668 B2* | 6/2009 | Philipp et al. | 365/148 |
| 7,558,100 B2* | 7/2009 | Ahn et al. | 365/148 |
| 7,701,750 B2* | 4/2010 | Shih et al. | 365/148 |
| 7,804,703 B2* | 9/2010 | Ha et al. | 365/148 |
| 7,907,436 B2* | 3/2011 | Maejima et al. | 365/148 |
| 2008/0089105 A1 | 4/2008 | Ro et al. | |
| 2009/0097300 A1* | 4/2009 | Ishihara et al. | 365/148 |
| 2009/0268509 A1* | 10/2009 | Maejima | 365/148 |
| 2010/0237346 A1* | 9/2010 | Kanno et al. | 257/49 |
| 2010/0277967 A1* | 11/2010 | Lee et al. | 365/148 |

FOREIGN PATENT DOCUMENTS

| | | |
|---|---|---|
| JP | 2005-522045 | 7/2005 |
| JP | 2006-86310 | 3/2006 |
| JP | 2008-78663 | 4/2008 |

OTHER PUBLICATIONS

U.S. Appl. No. 12/834,255, filed Jul. 12, 2010, Sato, et al.
U.S. Appl. No. 12/871,289, filed Aug. 30, 2010, Yasutake.

* cited by examiner

*Primary Examiner* — Son L Mai
(74) *Attorney, Agent, or Firm* — Oblon, Spivak, McClelland, Maier & Neustadt, L.L.P.

(57) ABSTRACT

A memory cell comprises a variable resistance film; a first conductive film having one surface contacted with one surface of the variable resistance film; and a second conductive film having one surface contacted with another surface of the variable resistance film. A width of the first conductive film or the second conductive film in a direction orthogonal to a direction that a current flows in the first conductive film or the second conductive film is smaller than a width of the variable resistance film in a direction orthogonal to a direction that a current flows in the variable resistance film. The width of the first conductive film and the second conductive film is smaller than a width of the first line and the second line in a direction orthogonal to a direction that a current flows in the first line and the second line.

20 Claims, 8 Drawing Sheets

SEMICONDUCTOR MEMORY DEVICE, METHOD OF MANUFACTURING THE SAME, AND METHOD OF SCREENING THE SAME

CROSS REFERENCE TO RELATED APPLICATIONS

This application is based on and claims the benefit of priority from the prior Japanese Patent Application No. 2009-70371, filed on Mar. 23, 2009, the entire contents of which are incorporated herein by reference.

BACKGROUND OF THE INVENTION

1. Field of the Invention

The present invention relates to a nonvolatile semiconductor memory device, more specifically to a semiconductor memory device configured as an arrangement of memory cells that are provided with a variable resistor and are operative to store data by changing the resistance of the variable resistor. In addition, the invention relates to a method of manufacturing the nonvolatile memory device, and a method of screening the same.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistance varying memory is attracting attention as a candidate to succeed these kinds of semiconductor memory devices utilizing a MOSFET as a memory cell (refer, for example, to Japanese Unexamined Patent Application Publication (Translation of PCT Application) No. 2005-522045). The resistive memory devices herein include resistive RAM (ReRAM), in a narrow sense, that uses a transition metal oxide as a recording layer and stores its resistance states in a non-volatile manner, as well as Phase Change RAM (PCRAM) that uses chalcogenide or the like as a recording layer to utilize the resistance information of crystalline states (conductors) and amorphous states (insulators).

Such a resistance varying memory has advantages that it is possible to adopt a cross-point cell structure in which memory cells are formed at an intersection point of crisscrossing bit lines and word lines, whereby miniaturization is facilitated in comparison to conventional memory cells, and, further, that it is possible to implement a stacking structure in a longitudinal direction, thereby facilitating an improved level of integration in the memory cells.

Two kinds of configurations for a variable resistor in the resistance varying memory are known. In one kind, known as a bipolar type, a high-resistance state and a low-resistance state are set by switching a polarity of an applied voltage. In the other kind, known as a unipolar type, setting of the high-resistance state and the low-resistance state are made possible by controlling a voltage value and a voltage application time, without switching the polarity of the applied voltage.

Write of data to a memory cell is implemented by applying for a short time to the variable resistor a certain voltage. As a result, the variable resistor changes from the high-resistance state to the low-resistance state. Hereinafter, this operation to change the variable resistor from the high-resistance state to the low-resistance state is called a setting operation.

In contrast, erase of data in the memory cell MC is implemented by applying for a long time to the variable resistor in the low-resistance state subsequent to the setting operation a certain voltage lower than that applied during the setting operation. As a result, the variable resistor changes from the low-resistance state to the high-resistance state. Hereinafter, this operation to change the variable resistor from a low-resistance state to a high-resistance state is called a resetting operation. The memory cell, for example, has the high-resistance state as a stable state (a reset state), and, in the case of binary data storage, data write is implemented by the setting operation which changes the reset state to the low-resistance state.

As miniaturization of the memory cells proceeds in such a resistance varying memory, there is an increased probability of a defect occurring, such as a short circuit in the variable resistor and the diode constituting the memory cell. There are various reasons for this. One reason is that a side wall of the variable resistor and the diode receive damage from etching, whereby a leak current becomes large. In the case of defective memory cells arising in this way, read and write likewise cannot be performed on memory cells connected to an identical bit line or word line as the defective memory cell, whereby yield ratio of the memory is worsened.

SUMMARY OF THE INVENTION

In accordance with a first aspect of the present invention, a nonvolatile semiconductor memory device, comprising a memory cell array including a memory cell, the memory cell being disposed between a first line and a second line and being configured by a variable resistor and a rectifier connected in series, the memory cell comprising: a variable resistance film configured to function as the variable resistor; a first conductive film having one surface contacted with one surface of the variable resistance film; a second conductive film having one surface contacted with another surface of the variable resistance film; and a rectifier layer having one surface contacted with another surface of the second conductive film and configured to function as the rectifier, a width of the first conductive film or the second conductive film in a direction orthogonal to a direction that a current flows in the first conductive film or the second conductive film being smaller than a width of the variable resistance film in a direction orthogonal to a direction that a current flows in the variable resistance film, and the width of the first conductive film and the second conductive film in the direction orthogonal to the direction that the current flows in the first conductive film and the second conductive film being smaller than a width of the first line and the second line in a direction orthogonal to a direction that a current flows in the first line and the second line.

In accordance with a second aspect of the present invention, a method of manufacturing a nonvolatile semiconductor memory device which includes a memory cell disposed between a first line and a second line and configured by a variable resistor and a rectifier connected in series, comprising: stacking sequentially a rectifier layer configured to function as the rectifier, a first conductive film, a variable resistance film configured to function as the variable resistor, and a second conductive film; patterning the rectifier layer, the first conductive film, the variable resistance film, and the second conductive film, and recessing a side surface of the first conductive film and a side surface of the second conductive film to reduce a width of the first conductive film and the second conductive film in a direction orthogonal to a direction that a current flows in the first conductive film and the second conductive film in comparison with a width of the variable resistance film in a direction orthogonal to a direction that a current flows in the variable resistance film; and having a width of the first conductive film and the second conductive film in a direction orthogonal to a direction that a current flows in the first conductive film and the second conductive film formed smaller than a width of the first line and the second line in a direction orthogonal to a direction that a current flows in the first line and the second line.

In accordance with a third aspect of the present invention, a method of screening a nonvolatile semiconductor memory device, the nonvolatile semiconductor memory device having a memory cell disposed between a first line and a second line, the memory cell comprising a variable resistance film configured to function as a variable resistor, a first conductive film having one surface contacted with one surface of the variable resistance film, a second conductive film having one surface contacted with another surface of the variable resistance film, and a rectifier layer having one surface contacted with another surface of the second conductive film and configured to function as the rectifier, comprises: applying a certain read voltage between the first line and the second line to which a selected memory cell is connected, to determine if the selected memory cell is a defective memory cell or not; and applying a breakdown voltage larger than a write voltage used in data write between the first line and the second line to which the defective memory cell is connected, thereby fusing the first conductive film or the second conductive film included in the defective memory cell.

DETAILED DESCRIPTION OF THE EMBODIMENTS

Figure 1:
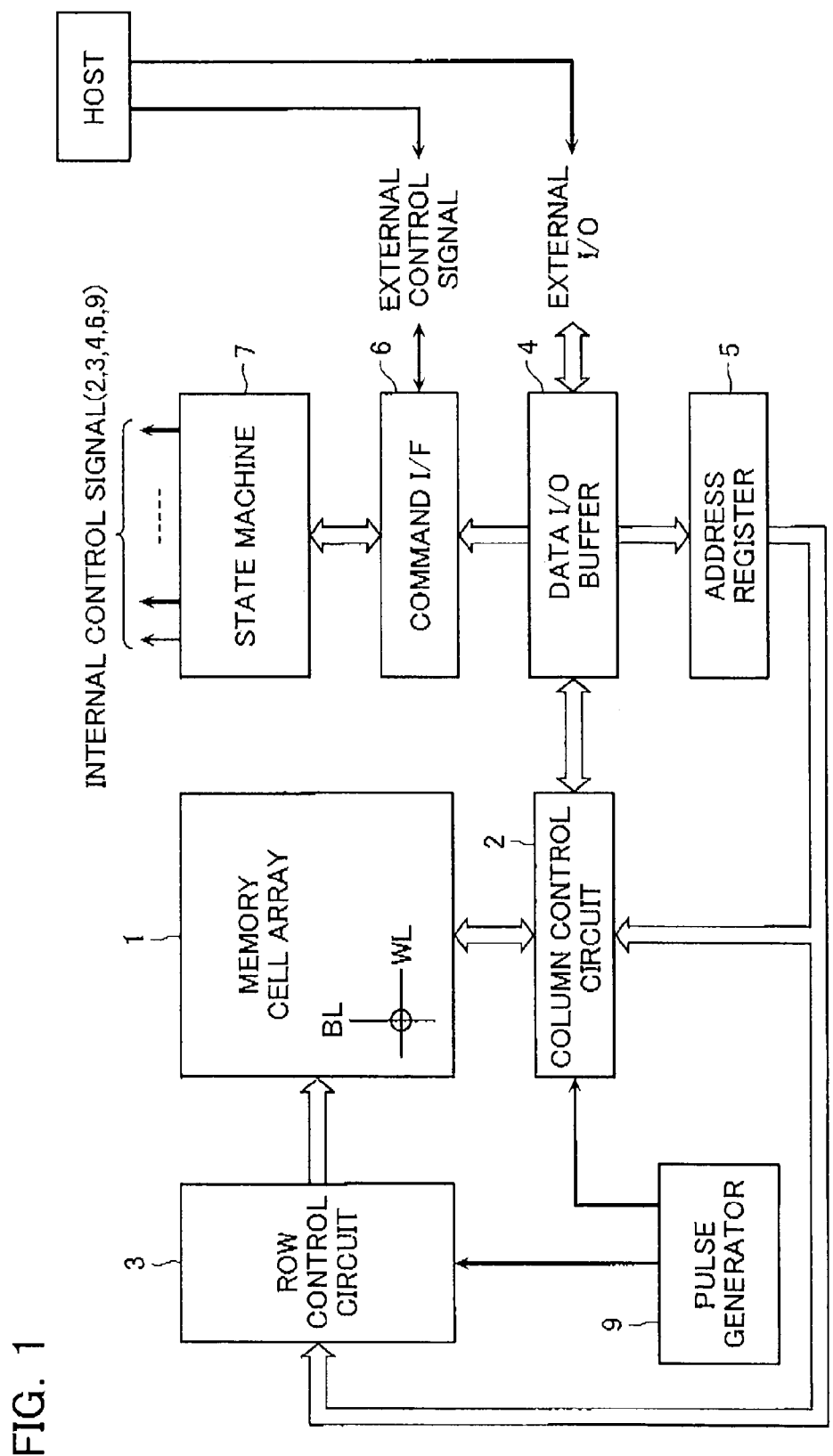
FIG. 1 is a block diagram of a nonvolatile semiconductor memory device in accordance with an embodiment of the present invention.

The embodiments of the invention will now be described in detail with reference to the drawings.
[Entire Configuration]
FIG. 1 is a block diagram of a nonvolatile memory in accordance with the embodiment of the present invention.

The non-volatile memory includes a memory cell array 1 including memory cells with ReRAM (variable resistive elements) described later arranged therein in a matrix form.

A column control circuit 2 is provided at a position adjacent to the memory cell array 1 in the bit line BL direction. It controls the bit line DL in the memory cell array 1 to erase data from the memory cell, write data in the memory cell, and read data out of the memory cell. A row control circuit 3 is provided at a position adjacent to the memory cell array 1 in the word line WL direction. It selects the word line WL in the memory cell array 1 and applies voltages required to erase data from the memory cell, write data in the memory cell, and read data out of the memory cell.

The data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via the address register 5 to the column control circuit 2 and the row control circuit 3.

A command fed from the host to the data I/O buffer 4 is sent to the command interface 6. The command interface 6 receives an external control signal from the host and decides whether the data fed to the data I/O buffer 4 is write data, a command or an address. If it is a command, then the command interface 6 transfers it as a received command signal to the state machine 7.

The state machine 7 manages the entire nonvolatile memory to receive commands from the host to execute read, write, erase, and execute data I/O management. The external host can also receive status information managed by the state machine 7 and decides the operation result. The status information is also utilized in control of write and erase.

The state machine 7 controls the pulse generator 9. Under this control, the pulse generator 9 is allowed to provide a pulse of any voltage at any timing.

Figure 2:
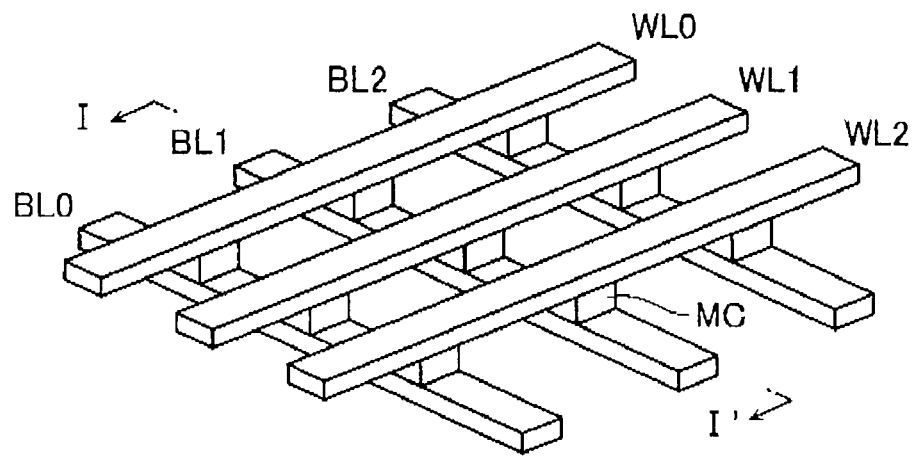
FIG. 2 is a perspective view of a part of the memory cell array 1.
Figure 3:
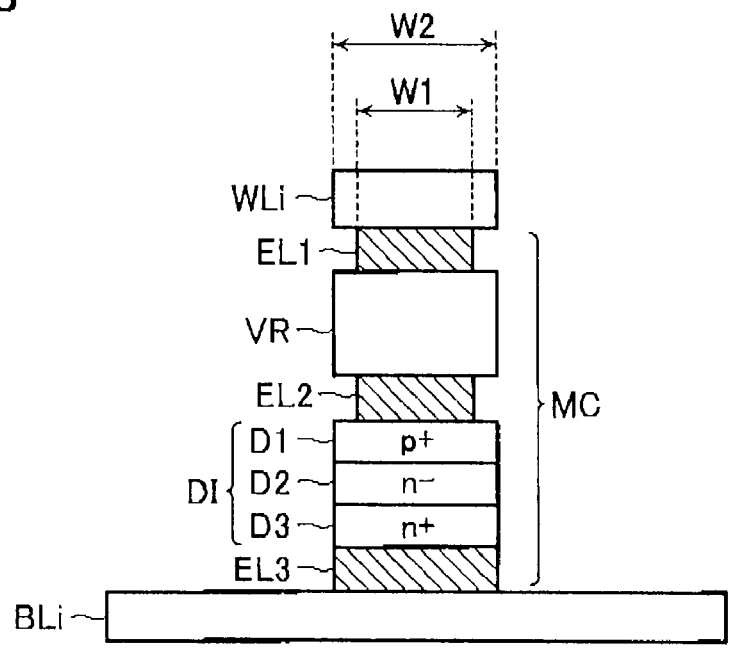
FIG. 3 is a cross-sectional view of one memory cell taken along the line I-I' and seen from the direction of the arrow in FIG. 2.

The pulse formed herein can be transferred to any line selected by the column control circuit 2 and the row control circuit 3. Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.
[Memory Cell Array and Peripheral Circuit]
FIG. 2 is a perspective view of a part of the memory cell array 1. FIG. 3 is a cross-sectional view of one memory cell taken along the line I~I' and seen from the direction of the arrow in FIG. 2. Word lines WL (WL0~WL2) as first wiring layers 10 are arranged in parallel, and bit lines BL (BL0~BL2) as second wiring layers 30 are arranged in parallel and intersecting with the word lines. Memory cells MC are arranged to be sandwiched by the word lines and the bit lines at intersections therebetween. The first and second wiring layers are preferably made from a material with good heat resistance and a low resistance, for example, tungsten (W), tungsten silicide (WSi), nickel silicide (NiSi), cobalt silicide (CoSi), or the like.

[Memory Cell MC]

The Memory cell MC comprises a series-connected circuit including a variable resistor VR and a diode DI as shown in FIG. 3. The variable resistor VR is formed of material that can change its resistance value through an electric current, heat, chemical energy caused by an application of a voltage. Disposed above and below the variable resistor VR are electrodes (electrode layers) EL1 and EL2. The electrodes EL1 and EL2 are formed from an identical material to a material constituting the diode DI. For example, in the case that the diode DI is formed from silicon, the electrodes EL1 and EL2 also are formed from a silicon layer doped with an impurity (phosphorus, boron, or the like). Hereafter, description proceeds assuming that the electrode EL1 is an n type semiconductor and the electrode EL2 is a p type semiconductor. However, both of the electrodes EL1 and EL2 may be a p type semiconductor or both of the electrodes EL1 and EL2 may be an n type semiconductor. Conversely, the electrode EL2 may be an n type semiconductor and the electrode EL1 may be a p type semiconductor.

In addition, if the diode DI is a Schottky diode including a metal, the electrodes EL1 and EL2 can also be constituted by the metal. As a material of an electrode EL3, a similar material to the electrodes EL1 and EL2 may be selected, or a different material may be selected. Moreover, a metal film for providing uniformity of orientation may also be inserted, in addition to the silicon layer or the above-described metal layer. Furthermore, a separate buffer layer, barrier metal layer, adhesive layer, and so on, may also be inserted. The buffer layer, barrier metal layer, adhesive layer, and so on, may be formed between the above-described silicon layer or metal layer and the variable resistor VR; or, they may be formed between the above-described silicon layer or metal layer and the word line WLi; further, they may be formed between the above-described silicon layer or metal layer and the diode DI.

Moreover, a width W1 (a width in a direction substantially orthogonal to a direction that a current flows in the memory cell) of the electrodes EL1 and EL2 is smaller than a width W2 of the variable resistor VR. As an example, the width W1 is set to about 0.7 times the width W2. During formation of the variable resistor VR, a side wall portion thereof receives substantial damage due to etching. This damage in the side wall portion causes short circuit defects and is a reason for the memory cell MC becoming a defective memory cell. As miniaturization progresses, such damage in the side wall increases proportionally, and effects of such damaged portions become great. That is, there is an increased possibility that the damage in the side wall causes a defective memory cell to be produced.

However, in the present embodiment, since the width W1 of the electrodes EL1 and EL2 is smaller than the width W2 of the variable resistor VR, a cell current can be configured not to flow in such a damaged portion of the side wall. Consequently, a large number of the various memory cells MC are able to function as normal memory cells, without being affected by the damage to the side wall of the variable resistor VR. Moreover, even in the case that a certain memory cell becomes a defective memory cell, a method of screening to be described hereafter can be used to destroy the defective memory cell by fusing the electrodes EL1 and EL2, thereby saving normal memory cells connected to a same bit line or a same word line as the defective memory cell. Since the electrodes EL1 and EL2 are made thin, they can be easily fused by a voltage only slightly larger than a voltage during write.

Note that in the case of the width W2 being set to 45 nm in accordance with a design rule, the width W1 can be thinned to a width of about 14 nm, after considering variations in processing and so on.

Furthermore, the width W1 of the electrodes EL1 and EL2 is made small compared to a width (a width in a direction orthogonal to a direction that a current flows in each line) of the word lines WLi (i=0-2) and the bit lines BLi. This prevents an excess current from causing the word lines WLi and the bit lines BLi to break before the electrodes EL1 and EL2.

[Resistance Change Element VR]

The resistance change element VR may include one that comprises a composite compound containing cations of a transition element and varies the resistance through migration of cations (ReRAM).

Figure 4:
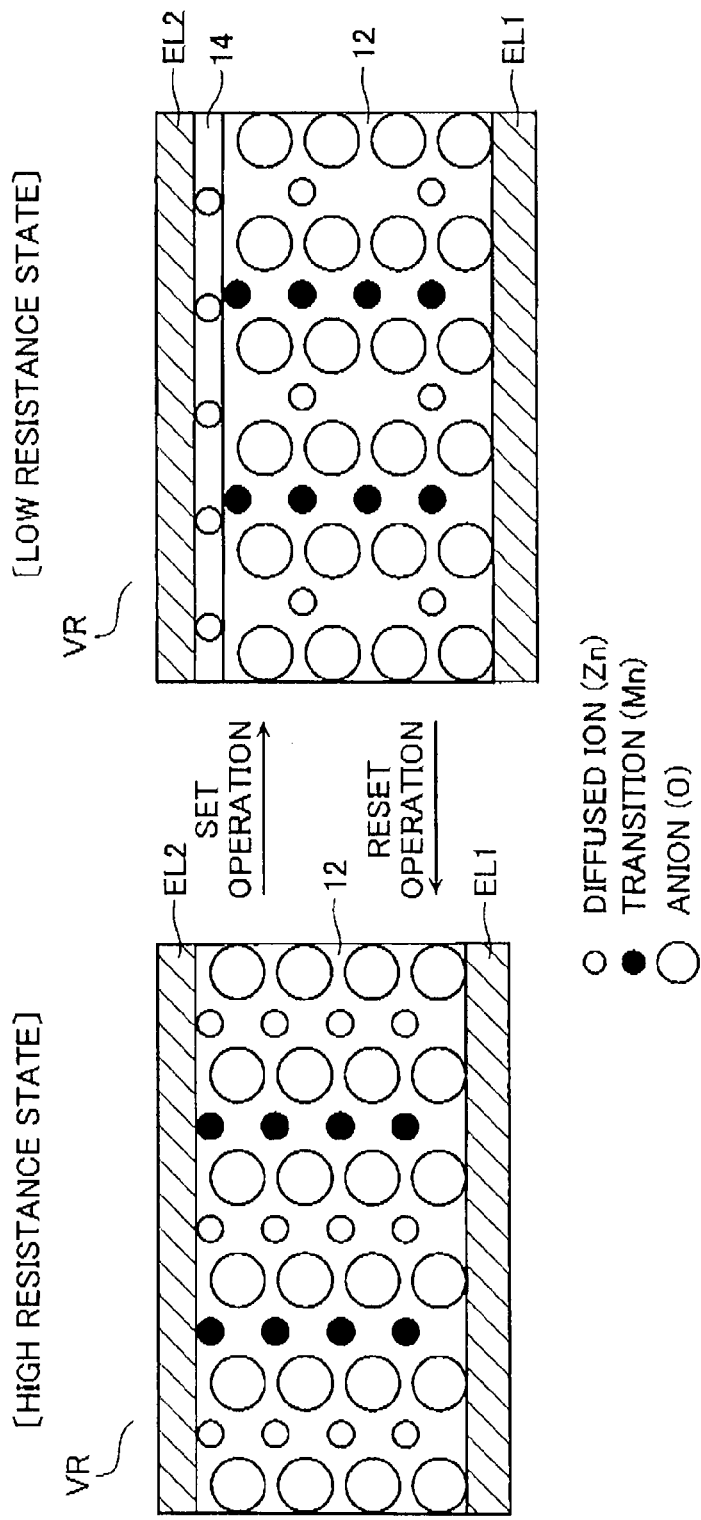
FIG. 4 is a view showing an example of a variable resistor VR.
Figure 5:
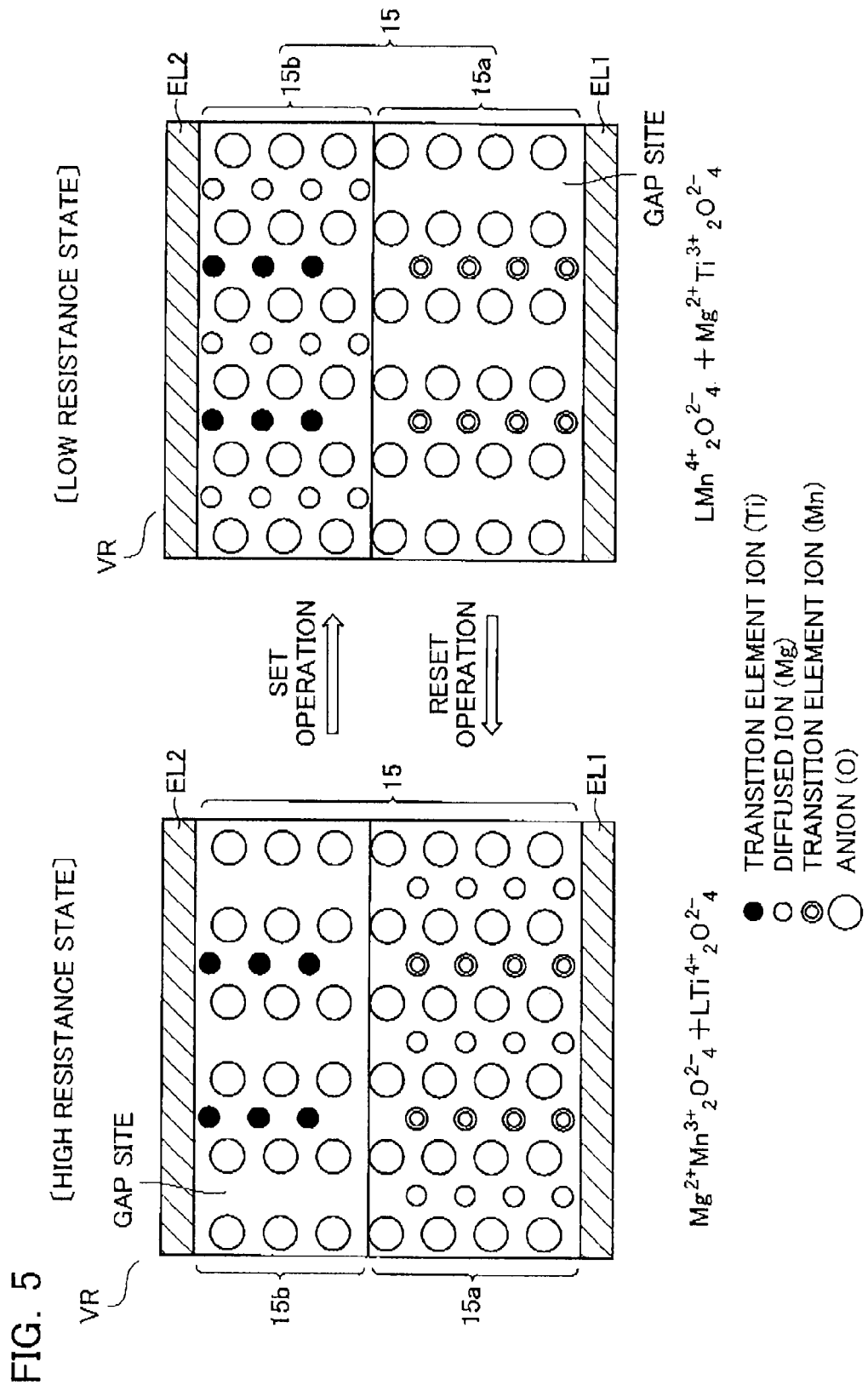
FIG. 5 is a view showing an example of a variable resistor VR.

FIGS. 4 and 5 are views showing examples of the resistance change element VR. The resistance change element VR shown in FIG. 4 includes a recording layer 12 arranged between the electrode EL1 and EL2. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$) a $LiMoN_2$ structure ($AMN_2$), a wolframite structure (AMU, an olivine structure ($A_2MO_4$) a hollandite structure ($A_xMO_2$), a ramsdellite structure ($A_xMO_2$), and a perovskite structure ($AMO_3$).

In the example of FIG. 4, $ZnMn_2O_4$ is used, A comprising Zn, M comprising Mn, and X comprising O. The variable resistor VR may also be configured by a thin film made from one of materials such as NiO, $TiO_2$, $SrZrO_3$, and $Pr_{0.7}Ca_{0.3}MnO_3$.

In FIG. 4, a small white circle in the recording layer 12 represents a diffused ion (Zn), a large white circle represents an anion (O), and a small black circle represents a transition element ion (Mn). An initial state of the recording layer 12 is a high-resistance state. When the electrode EL1 is kept at a fixed potential and a negative voltage is applied to the electrode EL2, part of diffused ions in the recording layer 12 migrate toward the electrode EL2 to reduce diffused ions in the recording layer 12 relative to anions.

The diffused ions arrived at the electrode EL2 accept electrons from the electrode EL2 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On data reading, a current may be allowed to flow, of which value is very small so that the material configuring the recording layer 12 causes no resistance variation. A programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example in FIG. 5, a recording layer 15 sandwiched by the electrode EL1 and EL2 is configured by two layers: a first compound layer 15a and a second compound layer 15b. The first compound layer 15a is arranged on a side close to the electrode EL1 and represented by a chemical formula $A_xM1_yX1_z$. The second compound layer 15b is arranged on a side close to the electrode EL2 and has gap sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

Potentials are given to the electrode EL1, EL2 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases.

In the initial state, the first and second compound layers 15a, 15b may be in the high-resistance state. In such a case, migration of part of diffused ions in the first compound layer 15a therefrom into the second compound layer 15b generates conduction carriers in the crystals of the first and second compounds, and thus both have electric conduction. The programmed state (low-resistance state) may be reset to an erased state (high-resistance state) by supplying a large current flow in the recording layer 15 for a sufficient time for Joule heating to facilitate the oxidation reduction reaction in the recording layer 15, as in the preceding example. Application of an electric field in the opposite direction from that at the time of setting may also allow reset.

[Modified Example of Memory Cell Array]

Figure 6:
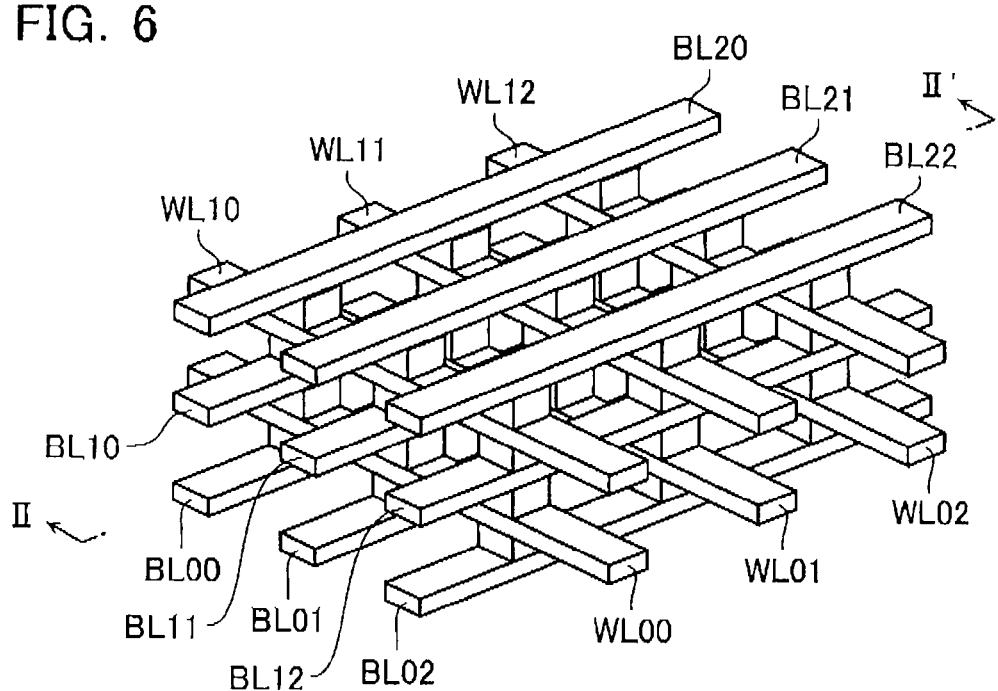
FIG. 6 illustrates another example of the structure of the memory cell array.
Figure 7:
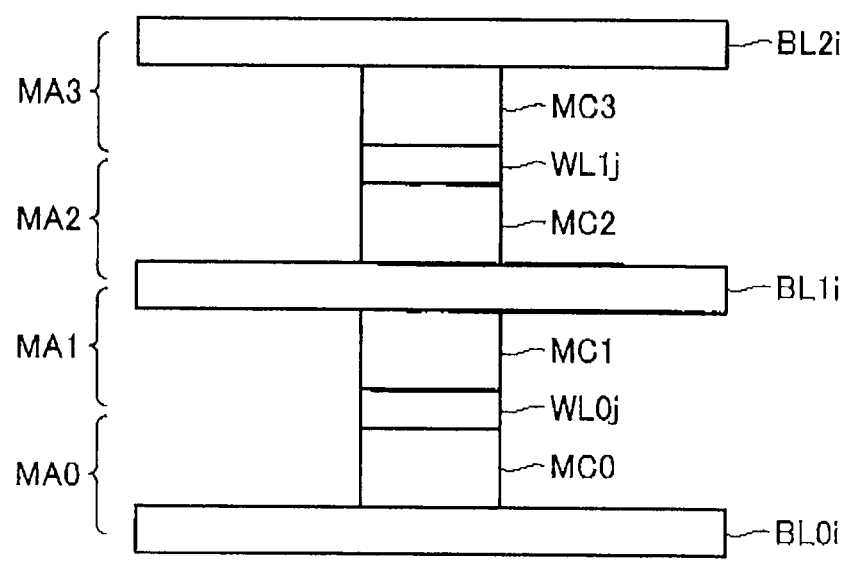
FIG. 7 illustrates another example of the structure of the memory cell array.

Plural such memory structures described above may be stacked to form a three-dimensional structure as shown in FIG. 6. FIG. 7 is a cross-sectional view showing an II-II' section in FIG. 6. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3.

In place of the line/cell/line/cell repetition, an interlayer insulator may be interposed as a line/cell/line/interlayer-insulator/line/cell/line between cell array layers. The memory cell array 1 may be divided into MATS of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 8:
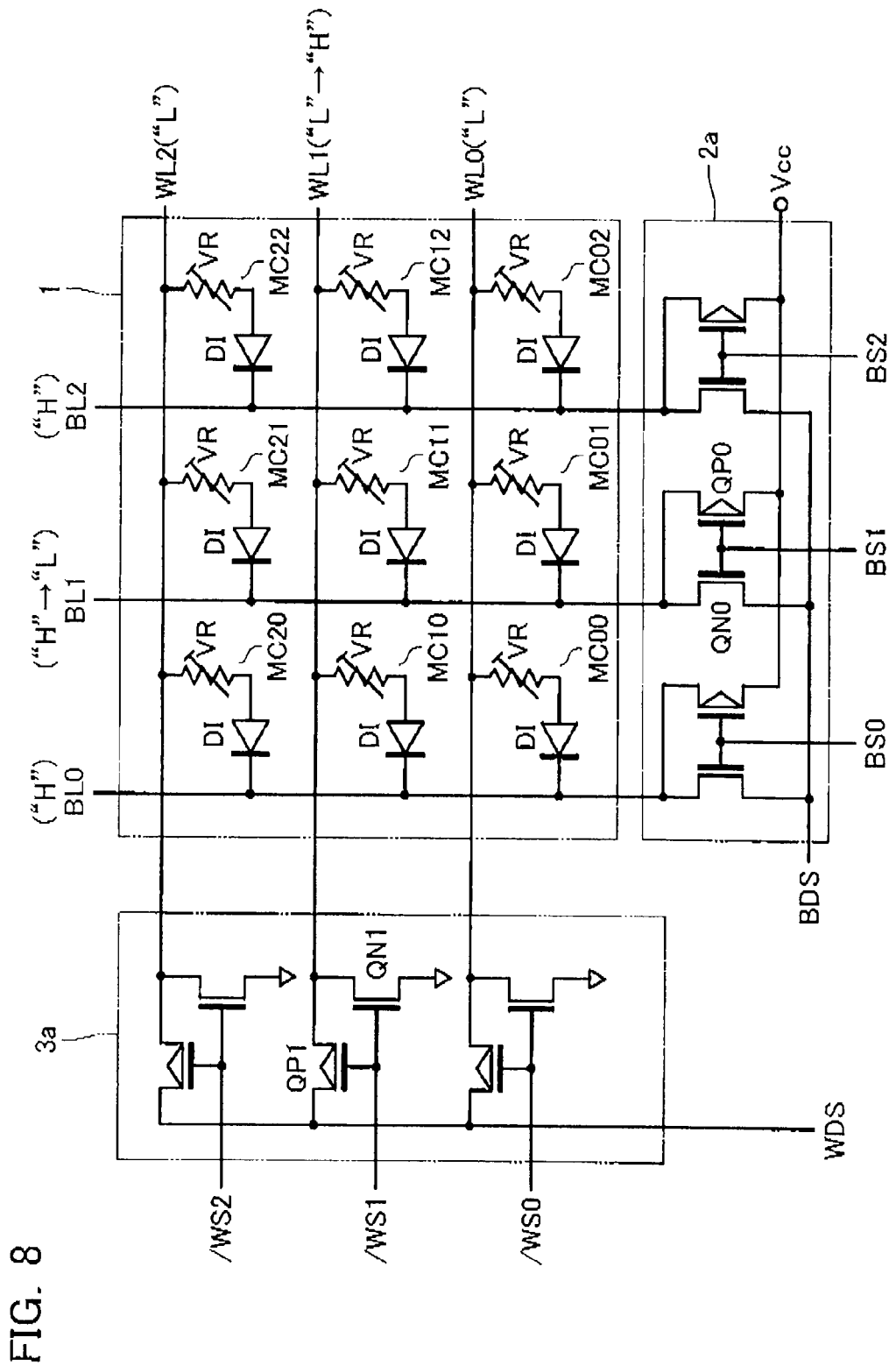
FIG. 8 illustrates a circuit diagram of the memory cell array 1 and the peripheral circuit.

FIG. 8 is a circuit diagram of the memory cell array 1 and peripheral circuits thereof. For simplicity, the description advances on the assumption that the memory has a single-layered structure. In FIG. 8, the diode contained in the memory cell MC has an anode connected to the word line WL and a cathode connected to the bit line BL via the variable resistor VR. Each bit line EL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi for selecting each bit line BL.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL1, sense amplifiers are arranged individually for the bit lines BL0-BL2, and the bit lines BL0-BL2 are connected to the sense amplifiers individually via the selection circuit 2a. Alternatively, the memory cell array 1 may be configured so that the polarity of the diode Di is reversed with respect to the circuit shown in FIG. 7, and a current flows from the bit line BL to the word line WL.

[Method of Manufacturing]

Figure 9:
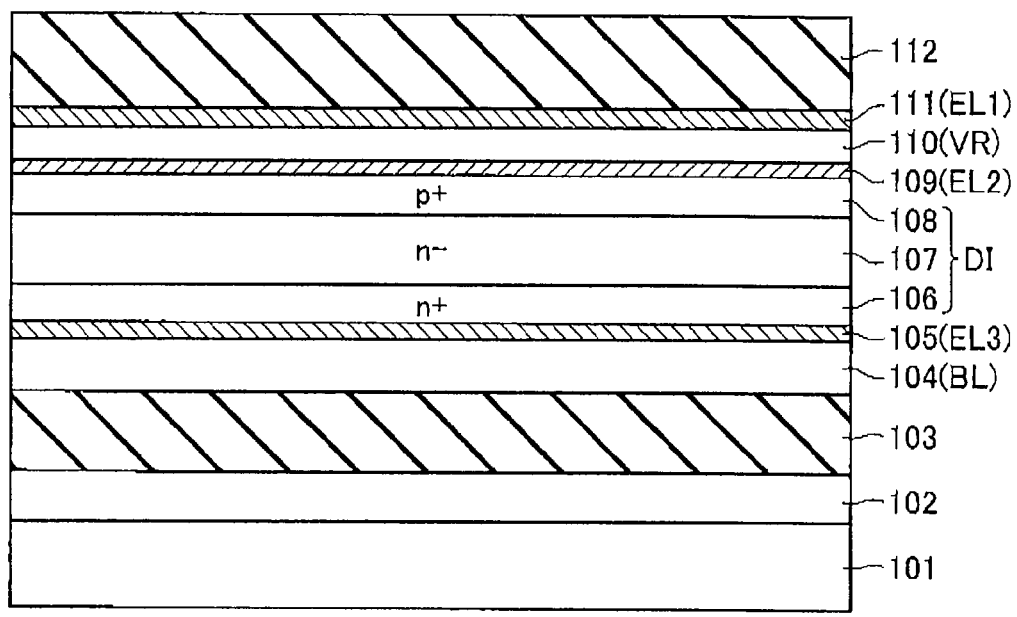
FIG. 9 illustrates a process chart in a method of manufacturing the nonvolatile semiconductor memory device in accordance with the embodiment of the present invention.
Figure 10:
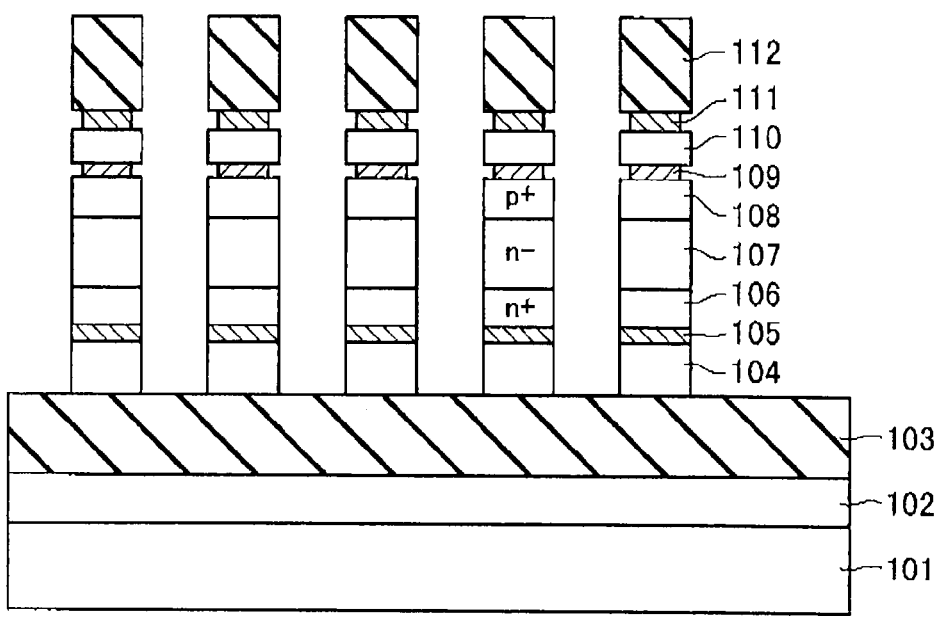
FIG. 10 illustrates a process chart in a method of manufacturing the nonvolatile semiconductor memory device in accordance with the embodiment of the present invention.
Figure 11:
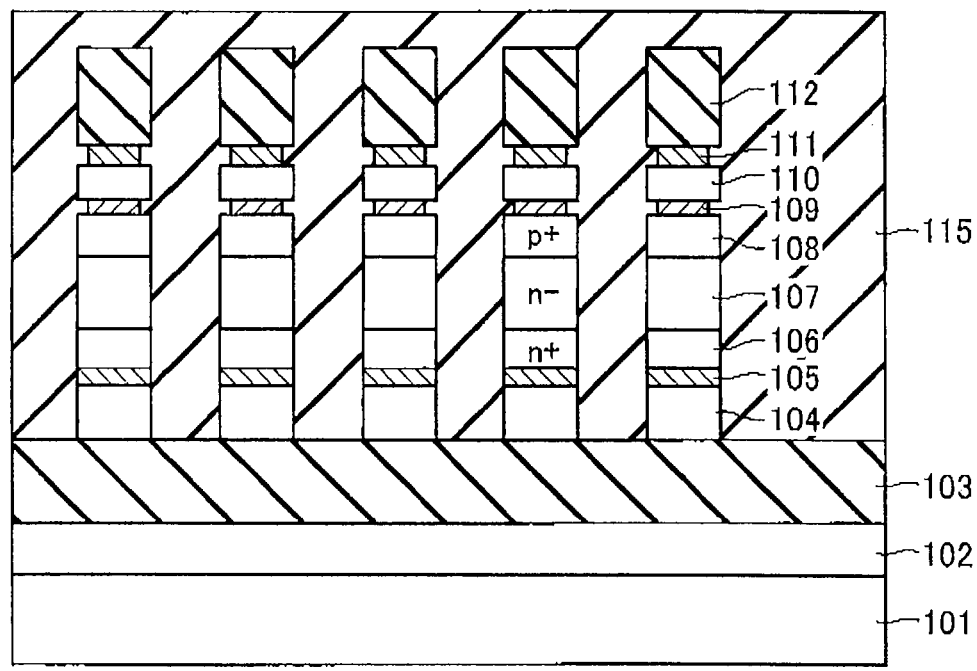
FIG. 11 illustrates a process chart in a method of manufacturing the nonvolatile semiconductor memory device in accordance with the embodiment of the present invention.

Next, a method of manufacturing the nonvolatile semiconductor memory device in accordance with the embodiment is described with reference to FIGS. 9-11. FIGS. 9-11 illustrate the method with a cross-sectional view along a direction orthogonal to the I-I' direction of FIG. 2.

First, as shown in FIG. 9, on one surface of a silicon substrate 101 having a thickness of 720 µm there is formed a CMOS circuit layer 102 that includes various kinds of CMOS circuit, and so on. Formed sequentially on the CMOS circuit layer 102 are an insulating film 103, a composite film 104, a titanium nitride film 105, an n+ type semiconductor region 106, an n− type semiconductor region 107, a p+ type semiconductor region 108, a n type silicon film 109, a resistance change material film 110, a p type silicon film 111, and an insulating film 112. The n type silicon film 109, and the p type silicon film 111 are formed aforementioned electrode EL1, EL2.

The CMOS circuit layer 102 is formed using a normal CMOS process. The CMOS circuit layer 102 includes a MOSFET included in such as a peripheral circuit, not shown, and multi-layered wiring for supplying various kinds of voltages and signals to the peripheral circuit and so on; in addition, the CMOS circuit layer 102 includes wiring portions and so on for connection to the memory cell array.

The insulating film 103 is formed by performing CVD with TEOS as a main material to deposit a silicon oxide film ($SiO_2$) with a film thickness of about 300 nm on the CMOS circuit layer 102.

The composite film 104 is configured as a stacked structure of a layer of titanium nitride (TiN) with a film thickness of 10 nm, and a layer of tungsten (W) with a film thickness of 50 nm formed on the insulating film 103, and is formed by sputtering. The composite film 104 is formed aforementioned bit line BL.

The titanium nitride film 105 is formed by, using a sputtering method, depositing a film of titanium nitride (TiN) with a film thickness of 10 nm on the composite film 104. The titanium nitride film 105 functions as a barrier metal for suppressing unnecessary diffusion of impurity into the n+ type layer D3 included in the diode DI.

The n+ type semiconductor region 106 is formed by depositing a film of amorphous silicon with a film thickness of 10 nm on the titanium nitride film 105, and then injecting the thus-created film with ions of arsenic (As) at an accelerating voltage of 1 keV, The n+ type semiconductor region 106 is an n+ type silicon layer formed by injecting arsenic (As) to an impurity concentration of about $10^{20}$ cm$^{-3}$. The n+ type semiconductor region 106 serves as the n+ type layer D3.

The n− type semiconductor region 107 is formed on the above-described n+ type semiconductor region 106. The n− type semiconductor region 107 is formed as follows. First, a film of amorphous silicon with a film thickness of 60 nm is deposited. Thereafter, a film composed of amorphous silicon-germanium mixture (a-Si$_{1-x}$Ge$_x$ (<x<=1)) with a film thickness of 10 nm is deposited by a low-pressure CVD method with monosilane (SiH4) and monogerman (GeH4) as a main material. Then, the resultant film is subject to an ion implantation of arsenic (As) at an accelerating voltage of 75 keV. Thereby the n− type semiconductor regions 107 with a film thickness of 90 nm and with arsenic (As) of $10^{17}$ cm$^{-3}$ in average is formed. This n−type semiconductor regions 107 functions as the n-type layer D2 of the diode DI.

On this n− type semiconductor region 107, the p+ type semiconductor region 108 is formed. The p+ type semiconductor region 108 is formed in the n− type semiconductor region 107 by performing an ion implantation of boron (B) with an accelerating voltage of 1 keV, thereby changing the upper part of the n− type semiconductor regions 107 into a p+-type semiconductor region. For example, p+ type semiconductor regions 108 may include boron (B) of $10^{20}$ cm$^{-3}$, and have a film thickness of 10 nm. The p+ type semiconductor region 108 functions as the p+ type layer D1 of the diode DI.

The n type silicon film 109 doped with phosphorous (P) with a film thickness of 10 nm, the resistance change material film 110 formed of ZnMn$_2$O$_4$ with a film thickness of 10 nm, and the p type silicon film 111 doped with boron (B) with a film thickness of 10 nm are formed sequentially on the p+ type semiconductor region 108 by sputtering. The n type silicon film 109 and the p type silicon film 111 each becomes the electrode EL1, EL2 of the resistance change element VR, and serves as a barrier metal. A separate titanium nitride film may also be interposed between the n type silicon film 109 and p type silicon film 111, and the resistance change material film 110. Moreover, since the higher a doping impurity concentration, the more easily performed is fusing in the screening to be described hereafter, it is preferable to set a suitable doping amount. A doped CVD deposition may be utilized in place of the sputtering. In this case, addition of AsH$_3$ gas for arsenic (As) doping, addition of PH3 gas for phosphorus (P) doping, and addition of BCl$_3$ gas for boron (B) doping may be utilized, respectively, and adjustment of the doping amount during deposition may be used to obtain a desired impurity concentration distribution.

Next, the insulating film 112 is formed, by using CVD with TEOS as a main material, by depositing silicon oxide with a film thickness of 150 nm.

Next, as shown in FIG. 10, the composite film 104, the titanium nitride film 105, the n+ type semiconductor region 106, the n− type semiconductor region 107, the p+ type semiconductor region 108, the n type silicon film 109, the resistance change film 110, the p type silicon film 111 and the insulating film 112 are subject to patterning. First, an imprint lithography technology is used to form a resist pattern having a pitch of 44 nm, the thus-obtained resist pattern being used as a mask in a reactive ion etching utilizing CHF$_3$ and CO gas, thereby patterning the insulating film 112.

Here, after stripping the resist, a pattern formed due to the insulating film 112 is used as an etching mask in a reactive ion etching utilizing Cl$_2$, Ar, and CO gas, thereby sequentially patterning the p type silicon film 111, the resistance change film 110, the n type silicon film 109, the p+ type semiconductor region 108, the n−type semiconductor region 107, the n+ type semiconductor region 106, and the titanium nitride film 105. Then, the composite film 104 is patterned by a reactive ion etching using CHF$_3$ gas and SF$_6$ gas. This etching causes the side wall of the silicon films 109 and 111 to recede more than the side wall of the resistance change material film 110, due to a difference in selectivity, whereby the width of the silicon films 109 and 111 becomes small compared to the width of the resistance change material film 110. A relationship (W1<W2) of the widths as shown in FIG. 3 can thus be obtained. In addition, since the silicon films 109 and 111 continue to be exposed to etching gas also during processing of the p+ type semiconductor region 108, the n−type semiconductor region 107, and the n+ type semiconductor region 106, the width of the silicon films 109 and 111 becomes smaller than that of these regions. Moreover, the width W1 of the n type silicon film 109 and the p type silicon film 111 is made smaller than a width of the composite film 104.

Subsequently, as shown in FIG. 11, a CVD method with TEOS as a main material is used to form an insulating film 115 constituted by silicon oxide (SiO$_2$). Then (not shown) the p type silicon film 111 is exposed using CMP or the like, and a composite film configured by stacking titanium nitride (TiN) with a film thickness of 10 nm and tungsten (W) with a film thickness of 50 nm is deposited on the exposed p type silicon film 111 by sputtering. This composite film becomes the word line WL. Then, each layer undergoes patterning also in a direction II-II' of FIG. 2, thereby completing a memory structure as shown in FIG. 2.

Note that when the memory cell array is formed in a multi-layer structure (FIG. 6), the aforementioned processes may be repeatedly conducted to obtain a desired multi-layered structure. In the aforementioned manufacturing process, phosphorous (P) may be used as an n type impurity instead of arsenic (As). Alternatively, by changing atoms to be injected in the ion-injecting step, it is possible to form a diode having a different lamination structure.

In the above-described example, a method of injecting impurity atoms into a silicon film formed by un-doped CVD deposition is used to form the diode DI; however, it is also possible to form the diode using doped CVD deposition. In this case, addition of AsH$_3$ gas for doping with arsenic (As), addition of PH3 gas for doping with phosphorus (P), and addition of BCl$_3$ gas for doping with boron (B) may be used, wherein adjusting a doping amount during deposition allows a desired impurity concentration distribution to be obtained.

Figure 12:
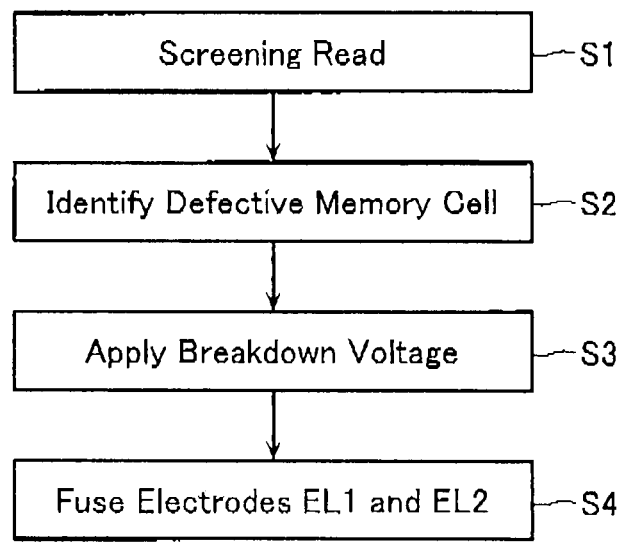
FIG. 12 illustrates a flowchart in a method of screening the nonvolatile semiconductor memory device in accordance with the embodiment of the present invention.

Next, a method of screening the nonvolatile semiconductor memory device in accordance with the present embodiment formed in this way is described with reference to FIG. 12.

First, a screening read operation to identify a defective memory cell is performed (step S1). Specifically, an "H" level voltage is applied to a selected word line WL and an "L" level voltage is applied to a selected bit line BL connected to a selected memory cell, and at the same time, an "L" level voltage is applied to a non-selected word line WL and an "H" level voltage is applied to a non-selected bit line BL. All the memory cells are assumed to be in an erased state (high-resistance state) when the screening read operation is performed. As a result, if the selected memory cell MC is a normal memory cell, a cell current does not flow, and, consequently, a potential of the selected word line WL does not fall from the "H" level. On the other hand, if the selected memory cell is a defective cell with a large leak, the cell current flows by passing through the defect, whereby a potential of the word line WL falls, and, conversely, a potential of the selected bit line BL rises. Using a sense amplifier circuit to detect such a change in the potential of the selected bit line BL enables the defective memory cell to be identified (step S2).

The defective memory cell thus identified has a breakdown voltage applied thereto (step S3). The defective memory cell is thereby destroyed due to fusing of the electrodes EL1 or EL2 in the defective memory cell (step S4). That is, the breakdown voltage is applied by applying a voltage higher than the write voltage used during the write operation (for example, 6 V) to the word line WL to which the defective memory cell is connected and applying 0 V to the bit line BL to which the defective memory cell is connected. If the defective memory cell is destroyed in this way and a current prevented from flowing, it becomes possible to perform the write operation and the read operation normally on memory cells connected to the same bit line and word line.

This concludes description of embodiments in accordance with the present invention, but it should be noted that the present invention is not limited to the above-described embodiments, and that various alterations, additions, and so on, are possible within a range not departing from the scope and spirit of the invention. For example, in the method of manufacturing in the above-described embodiment, a difference in selectivity in RIE is used to make the width of the silicon films 109 and 111 smaller than the width of the resistance change material film 110. However, the present invention is not limited to this embodiment, and a position of a side surface of the silicon films 109 and 111 can also be caused to recede by further executing a separate wet etching subsequent to execution of RIE.

Moreover, in the above-described embodiment, the electrodes EL1 and EL2 are both made from the same material as the material of the diode DI (example: silicon) and are both configured to have a smaller width than the width of the variable resistor VR. However, the present invention is not limited to this embodiment, and it is possible for only one of the electrodes EL1 and EL2 to be formed from silicon and the other to be formed from a separate material (titanium silicide or the like), and for the width of the electrodes EL1 and EL2 to be the same as that of the variable resistor VR. In addition, it is sufficient for the electrodes EL1 and EL2 to be made from a material that is easily etched compared to the material of the variable resistor VR, and a similar advantage can be achieved in the case that the variable resistor VR is constituted from $ZnMn_2O_4$ by, for example, forming the electrodes EL1 and EL2 from titanium, tungsten, aluminum, carbon or the like.

What is claimed is:

1. A nonvolatile semiconductor memory device, comprising a memory cell array including a memory cell, the memory cell being disposed between a first line and a second line and being configured by a variable resistor and a rectifier connected in series, the memory cell comprising:
a variable resistance film configured to function as the variable resistor;
a first conductive film having one surface contacted with one surface of the variable resistance film;
a second conductive film having one surface contacted with another surface of the variable resistance film; and
a rectifier layer having one surface contacted with another surface of the second conductive film and configured to function as the rectifier,
a width of the first conductive film or the second conductive film in a direction orthogonal to a direction that a current flows in the first conductive film or the second conductive film being smaller than a width of the variable resistance film in a direction orthogonal to a direction that a current flows in the variable resistance film, and
the width of the first conductive film and the second conductive film in the direction orthogonal to the direction that the current flows in the first conductive film and the second conductive film being smaller than a width of the first line and the second line in a direction orthogonal to a direction that a current flows in the first line and the second line.

2. The nonvolatile semiconductor memory device according to claim 1,
wherein the first conductive film and the second conductive film are formed from an identical material to a material of the rectifier layer.

3. The nonvolatile semiconductor memory device according to claim 1,
wherein the first conductive film and the second conductive film are formed such that application thereto of a breakdown voltage larger than a write voltage to the memory cell may cause breakdown of the first conductive film or the second conductive film.

4. The nonvolatile semiconductor memory device according to claim 1,
wherein the first conductive film and the second conductive film are a p type silicon layer or an n type silicon layer doped with an impurity.

5. The nonvolatile semiconductor memory device according to claim 1,
wherein one of the first conductive film and the second conductive film is constituted by silicon and the other of the first conductive film and the second conductive film is constituted by a silicide.

6. The nonvolatile semiconductor memory device according to claim 1,
wherein the first conductive film and the second conductive film are constituted by a material more easily etched than the variable resistance film.

7. The nonvolatile semiconductor memory device according to claim 6,
wherein the variable resistance film is constituted by $ZnMn_2O_4$, and
wherein the first conductive film and the second conductive film are constituted, respectively, by any one of titanium, tungsten, aluminum, and carbon.

8. The nonvolatile semiconductor memory device according to claim 1, further comprising a control circuit configured to control a voltage applied to the memory cell,
wherein the control circuit applies a certain read voltage between the first line and the second line to which a selected memory cell is connected, to determine if the selected memory cell is a defective memory cell or not, and wherein the control circuit applies a breakdown voltage larger than a write voltage used in data write between the first line and the second line to which the defective memory cell is connected, thereby fusing the first conductive film or the second conductive film included in the defective memory cell.

9. The nonvolatile semiconductor memory device according to claim 8,
wherein the control circuit applies a voltage in a forward direction of the rectifier in the selected memory cell, and, conversely, applies a voltage in a reverse direction of the rectifier in a non-selected memory cell.

10. A method of manufacturing a nonvolatile semiconductor memory device which includes a memory cell disposed between a first line and a second line and configured by a variable resistor and a rectifier connected in series, comprising:
stacking sequentially a rectifier layer configured to function as the rectifier, a first conductive film, a variable resistance film configured to function as the variable resistor, and a second conductive film;
patterning the rectifier layer, the first conductive film, the variable resistance film, and the second conductive film, and recessing a side surface of the first conductive film and a side surface of the second conductive film to reduce a width of the first conductive film and the second conductive film in a direction orthogonal to a direction that a current flows in the first conductive film and the second conductive film in comparison with a width of the variable resistance film in a direction orthogonal to a direction that a current flows in the variable resistance film; and
having a width of the first conductive film and the second conductive film in a direction orthogonal to a direction that a current flows in the first conductive film and the second conductive film formed smaller than a width of the first line and the second line in a direction orthogonal to a direction that a current flows in the first line and the second line.

11. The method of manufacturing a nonvolatile semiconductor memory device according to claim 10,
wherein the first conductive film and the second conductive film are formed from an identical material to a material of the rectifier layer.

12. The method of manufacturing a nonvolatile semiconductor memory device according to claim 10,
wherein the first conductive film and the second conductive film are formed such that application thereto of a breakdown voltage larger than a write voltage to the memory cell may cause breakdown of the first conductive film or the second conductive film.

13. The method of manufacturing a nonvolatile semiconductor memory device according to claim 10,
wherein the first conductive film and the second conductive film are a p type silicon layer or an n type silicon layer doped with an impurity.

14. The method of manufacturing a nonvolatile semiconductor memory device according to claim 10,
wherein one of the first conductive film and the second conductive film is constituted by silicon and the other of the first conductive film and the second conductive film is constituted by a silicide.

15. The method of manufacturing a nonvolatile semiconductor memory device according to claim 10,
wherein the first conductive film and the second conductive film are constituted by a material more easily etched than the variable resistance film.

16. The method of manufacturing a nonvolatile semiconductor memory device according to claim 15,
wherein the variable resistance film is constituted by $ZnMn_2O_4$, and
wherein the first conductive film and the second conductive film are constituted, respectively, by any one of titanium, tungsten, aluminum, and carbon.

17. A method of screening a nonvolatile semiconductor memory device, the nonvolatile semiconductor memory device having a memory cell disposed between a first line and a second line, the memory cell comprising a variable resistance film configured to function as a variable resistor, a first conductive film having one surface contacted with one surface of the variable resistance film, a second conductive film having one surface contacted with another surface of the variable resistance film, and a rectifier layer having one surface contacted with another surface of the second conductive film and configured to function as the rectifier, comprising:
applying a certain read voltage between the first line and the second line to which a selected memory cell is connected, to determine if the selected memory cell is a defective memory cell or not; and
applying a breakdown voltage larger than a write voltage used in data write between the first line and the second line to which the defective memory cell is connected, thereby fusing the first conductive film or the second conductive film included in the defective memory cell.

18. The method of screening a nonvolatile semiconductor memory device according to claim 17,
wherein, during determining if the selected memory cell is a defective memory cell or not, a voltage is applied in a forward direction of the rectifier in the selected memory cell, and, conversely, a voltage is applied in a reverse direction of the rectifier in a non-selected memory cell.

19. The method of screening a nonvolatile semiconductor memory device according to claim 17,
wherein a width of the first conductive film or the second conductive film in a direction orthogonal to a direction that a current flows in the first conductive film or the second conductive film is made smaller than a width of the variable resistance film in a direction orthogonal to a direction that a current flows in the variable resistance film, and
wherein the width of the first conductive film and the second conductive film in the direction orthogonal to the direction that the current flows in the first conductive film and the second conductive film is made smaller than a width of the first line and the second line in a direction orthogonal to a direction that a current flows in the first line and the second line.

20. The method of screening a nonvolatile semiconductor memory device according to claim 17,
wherein the first conductive film and the second conductive film are formed from an identical material to a material of the rectifier layer.

* * * * *